(12) United States Patent
Yang et al.

(10) Patent No.: US 8,946,712 B2
(45) Date of Patent: Feb. 3, 2015

(54) LIGHT BLOCKING MEMBER HAVING VARIABLE TRANSMITTANCE, DISPLAY PANEL INCLUDING THE SAME, AND MANUFACTURING METHOD THEREOF

(75) Inventors: Byung-Duk Yang, Yongin-si (KR); Vladimir Urazaev, Suwon-si (KR); Sung-Wook Kang, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/586,566

(22) Filed: Aug. 15, 2012

(65) Prior Publication Data

US 2012/0322182 A1      Dec. 20, 2012

Related U.S. Application Data

(62) Division of application No. 12/468,545, filed on May 19, 2009, now Pat. No. 8,268,412.

(30) Foreign Application Priority Data

Dec. 4, 2008    (KR) .......................... 10-2008-0122711

(51) Int. Cl.
*H01L 29/04* (2006.01)
*H01L 27/12* (2006.01)
*G02F 1/1362* (2006.01)
(Continued)

(52) U.S. Cl.
CPC .......... *H01L 27/12* (2013.01); *G02F 1/136209* (2013.01); *H01L 29/78633* (2013.01); *G02F 1/0147* (2013.01); *G02F 2203/62* (2013.01); *G02F 2001/136222* (2013.01); *H01L 27/1214* (2013.01)

USPC ................. 257/59; 257/66; 257/72; 257/390; 257/443; 257/E21.411; 257/E21.412; 438/30; 438/149; 438/158; 349/43

(58) Field of Classification Search
None
See application file for complete search history.

(56) References Cited

U.S. PATENT DOCUMENTS

2006/0073398 A1    4/2006   Kang et al.
2006/0250536 A1*  11/2006   Kim ............................... 349/43
(Continued)

FOREIGN PATENT DOCUMENTS

| JP | 56-97383 | 8/1981 | |
|---|---|---|---|
| JP | 07-081229 | * 3/1995 | ............... B41M 5/26 |
| JP | 07-258569 | 10/1995 | |

(Continued)

OTHER PUBLICATIONS

Non-Final Office Action issued for related U.S. Appl. No. 12/468,545 dated Jan. 18, 2012.

(Continued)

*Primary Examiner* — Steven Loke
*Assistant Examiner* — Cuong B Nguyen
(74) *Attorney, Agent, or Firm* — H.C. Park & Associates, PLC

(57) ABSTRACT

A light blocking member having variable transmittance, a display panel including the same, and a manufacturing method thereof. A light blocking member having a variable transmittance according to one exemplary embodiment includes a polymerizable compound, a binder, and a thermochromic material that exhibits a black color at a temperature below a threshold temperature and becomes transparent at a temperature above the threshold temperature.

5 Claims, 3 Drawing Sheets

(51) Int. Cl.
*H01L 29/786* (2006.01)
*G02F 1/01* (2006.01)

(56) References Cited

U.S. PATENT DOCUMENTS

2008/0013019 A1* 1/2008 Sugiyama .................... 349/108
2008/0198098 A1* 8/2008 Gelbman et al. .............. 345/59

FOREIGN PATENT DOCUMENTS

| JP | 08-015727 | 1/1996 |
| JP | 08-254694 | 10/1996 |
| JP | 10-265772 | 10/1998 |
| JP | 2004-191972 | 7/2004 |
| JP | 2006-099033 | 4/2006 |
| JP | 2006-103048 | 4/2006 |
| JP | 2007-086410 | 4/2007 |
| JP | 2007-102163 | 4/2007 |
| JP | 2008-233476 | 10/2008 |
| KR | 1020040053677 | 6/2004 |

OTHER PUBLICATIONS

Final Office Action issued for related U.S. Appl. No. 12/468,545 dated May 23, 2012.
Notice of Allowance issued for related U.S. Appl. No. 12/468,545 dated Jul. 20, 2012.

* cited by examiner

LIGHT BLOCKING MEMBER HAVING VARIABLE TRANSMITTANCE, DISPLAY PANEL INCLUDING THE SAME, AND MANUFACTURING METHOD THEREOF

CROSS REFERENCE TO RELATED APPLICATION

This application is a divisional of U.S. patent application Ser. No. 12/468,545, filed on May 19, 2009, and claims priority from and the benefit of Korean Patent Application No. 10-2008-0122711, filed on Dec. 4, 2008, which are hereby incorporated by reference for all purposes as if fully set forth herein.

BACKGROUND OF THE INVENTION

1. Field of the Invention

Aspects of the present invention relate to a light blocking member having variable transmittance, a display panel including the same, and a manufacturing method thereof.

2. Discussion of the Background

A liquid crystal display (LCD) is one of the most commonly used flat panel displays, and it includes two substrates with electrodes formed thereon and a liquid crystal layer interposed between the two substrates. In the LCD, a voltage is applied to the electrodes to realign liquid crystal molecules of the liquid crystal layer to thereby regulate the transmittance of light passing through the liquid crystal layer.

Among LCDs, an LCD having a structure in which field generating electrodes are respectively formed on two display panels is widely used. A plurality of pixel electrodes and thin film transistors are arranged in a matrix format on one of the two display panels. The other display panel includes red, green, and blue color filters, a light blocking member, and one common electrode, which covers the entire surface of the other display panel.

However, in a liquid crystal display where the pixel electrodes are disposed on a different display panel than the light blocking member and the color filters, it may be difficult to align the pixel electrodes and the color filters or the pixel electrodes and the light blocking member to each other without generating an alignment error. To solve this problem, a structure in which the pixel electrodes, the light blocking member, and the color filters are formed on the same display panel has been provided. That is, the light blocking member is formed on a thin film transistor display panel including the pixel electrodes to produce a display device having a high aperture ratio and high transmittance.

When the light blocking member is formed on the same display panel as the pixel electrodes and thin film transistors, the light blocking member may cover the thin film transistors, data lines, and a portion of each pixel electrode. However, the light blocking member blocks light at the portion where the thin film transistors are disposed such that it may be difficult to observe several constituent elements of the thin film transistor display panel such as where the thin film transistors, the data lines, and the pixel electrodes are formed during such processes as a developing process, a manufacturing process, or a defect inspection process of the display panel.

SUMMARY OF THE INVENTION

Exemplary embodiments of the present invention provide a light blocking member that has variable transmittance, a display panel including the same, and a manufacturing method thereof.

Additional features of the invention will be set forth in the description which follows, and in part will be apparent from the description, or may be learned by practice of the invention.

A light blocking member having variable transmittance according to an embodiment of the present invention includes a polymerizable compound, a binder, and a thermochromic material that exhibits a black color (blocks light) at a temperature below a threshold temperature and becomes transparent at a temperature above the threshold temperature.

The threshold temperature may be in a range from −20° C. to 90° C. More preferably, the threshold temperature may be in a range from 78° C. to 82° C.

While not required in all aspects, the variable transmittance may be changed within a range of 1° C. to 2° C. with reference to the threshold temperature. While not required in all aspects, a transmittance change with reference to the threshold temperature of the thermochromic material may be reversible. At least one of carbon black and a color pigment may be further included in the light blocking member having variable transmittance according to an embodiment.

While not required in all aspects, an optical density of the light blocking member having the variable transmittance may be equal to or more than 3.0 at a temperature below the threshold temperature and equal to or less than 2.0 at a temperature above the threshold temperature.

The thermochromic material may comprise at least one of (a) an acid-responsive chromogeneic substance comprising a triphenylmethanephthalide compound, a phthalide compound, a phthalan compound, an acyl-leucomethylene blue compound, a fluoran compound, a triphenylmethane compound, and a diphenylmethane compound, (b) a spiropyran compound, (c) an acidic substance comprising 5-butylbenzotriazole, bisbenzotriazole-5-methane, phenol, nonylphenol, bisphenol A, bisphenol F, 2,2'-biphenol, beta-naphthol, 1,5-dihydroxynaphthalene, an alky p-hydroxybenzoate, and a phenol resin oligomer, (d) rylene dyes, (e) a bridged phthalide, (f) a sulfinate ester, (g) an electron donating chromogeneic organic compound, (h) an electron accepting compound, (i) at least one desensitizer selected from diphenylamine derivatives, (j) at least one desensitizer selected from carbazole derivatives and an electron-donating chromogeneic material, (k) a 1,2,3-triazole compound, (l) an azomethine or a carboxylic acid salt, (m) an alcohol, an amide, or an ester solvent, (n) 6-(dimethylamino)-3,3-bis-(dimethylaminophenyl)-1-(3H)isobenzofuranone (crystal violet lactone), (o) 7-anilino-6-diethylamino-3-methylfluoran, (p) 2'-dibenzylamino-6'-diethylaminofluoran, 3,3-bis-(1-butyl-2-methyl-1-H-indol-3-yl)-1 3H-isobenzofuranone, (q) 3-(4-dimethylaminophenyl)-3-(N,N-bis-(4-octylphenyl)amino)phthalide, (r) 2,4,8,10-tetraiodo-3,9-dihydroxy-6-(3',4',5',6'-tetrachlorophenyl-2-phthalido)xanthenone (rose Bengal lactone), (s) 3,3-bis-(4'-hydroxy-3'-methyl-5'-dicarboxymethylaminomethyl)phenyliosbenzofuran-3-one(o-cresolphthalein complexone), (t) 3,3-bis-(sodium-3'-sulfonato-4'-hydroxyphenyl)-4,5,6,7-tetrabromoisobenzofuran-3-one (sulfobromonaphthalein sodium salt), and (u) 3,3-bis-(3',5'-dibromo-4-hydroxyphenyl) isobenzofuran-3-one tetrabromophenolphthalein bromocresol (green thymolphthalein).

A display panel according to an exemplary embodiment of the present invention includes: a substrate; a plurality of signal lines disposed on the substrate; a plurality of thin film transistors disposed on the substrate; a plurality of color filters disposed on the signal lines and the thin film transistors; a light blocking member disposed on the signal lines and the thin film transistors; and a plurality of pixel electrodes disposed on the color filters and the light blocking member, and respectively connected to the thin film transistors, wherein the light blocking member comprises a thermochromic material that exhibits a black color at a temperature below a threshold temperature and becomes transparent at a temperature above the threshold temperature.

The light blocking member may further comprise a polymerizable compound and a binder. The threshold temperature may be in a range from −20° C. to 90° C., and preferably, in a range from 78° C. to 82° C. A transmittance of the light blocking member may be changed within a range of 1° C. to 2° C. with reference to the threshold temperature.

While not required in all aspects, a transmittance change with reference to the threshold temperature of the thermochromic material may be reversible. An optical density of the light blocking member may be equal to or more than 3.0 at a temperature below the threshold temperature and equal to or less than 2.0 at a temperature above the threshold temperature.

A manufacturing method of a display panel according to an exemplary embodiment of the present invention includes: forming signal lines and thin film transistors on a substrate; forming a plurality of color filters on the signal lines and the thin film transistors; forming a light blocking member comprising a thermochromic material on the signal lines and the thin film transistors; and forming a plurality of pixel electrodes on the color filters and the light blocking member, wherein the thermochromic material exhibits a black color at a temperature below a threshold temperature and becomes transparent at a temperature above the threshold temperature.

The photosensitive organic material may further comprise a polymerizable compound and a binder. The threshold temperature may be in a range from 78° C. to 82° C. A transmittance of the thermochromic material may be changed within a range of 1° C. to 2° C. with reference to the threshold temperature. While not required in all aspects, a transmittance change with reference to the threshold temperature of the thermochromic material may be reversible. An optical density of the light blocking member may be equal to or more than 3.0 at a temperature below the threshold temperature and equal to or less than 2.0 at a temperature above the threshold temperature.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
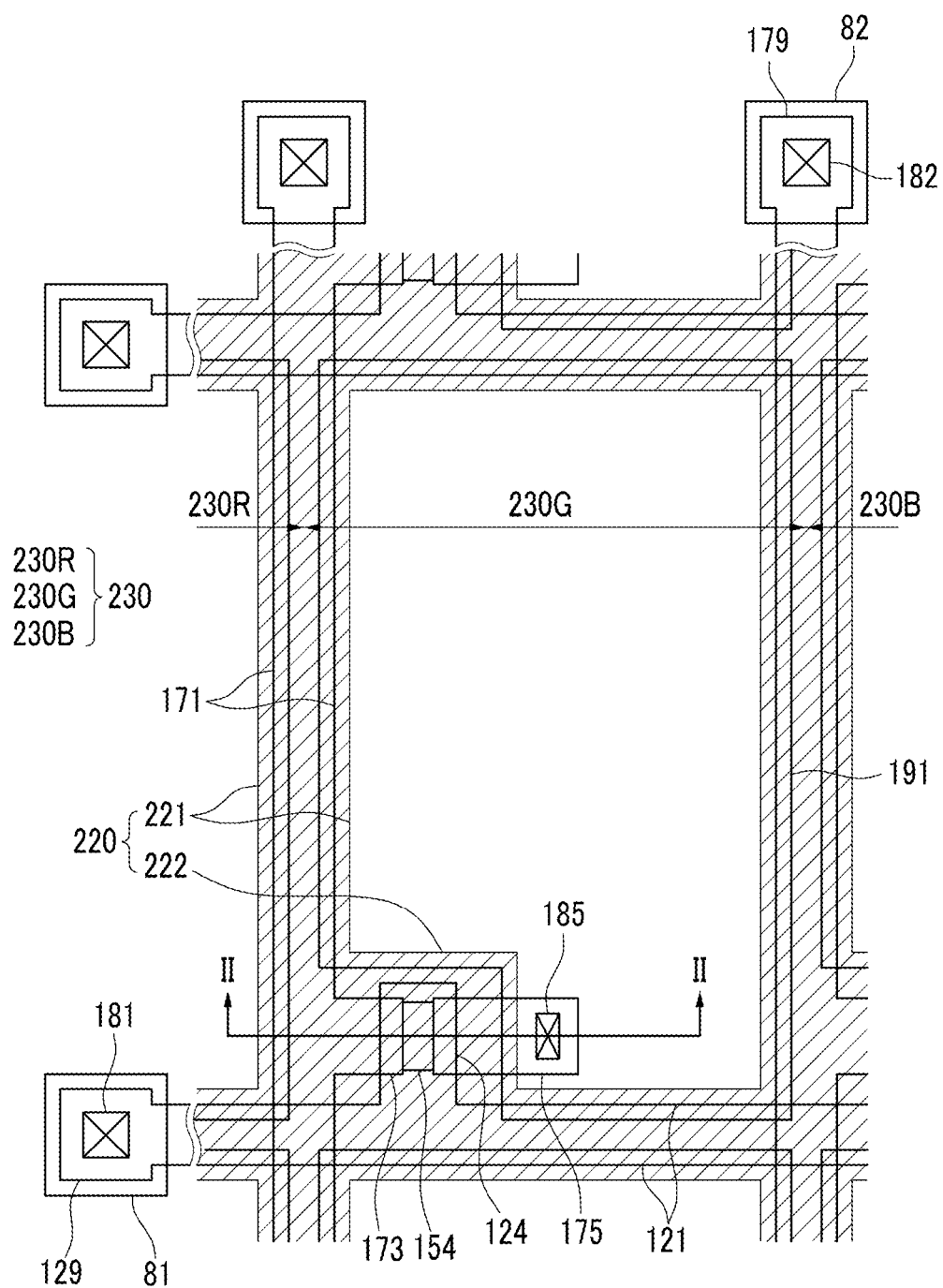
FIG. 1 is a layout view of a liquid crystal display (LCD) according to an exemplary embodiment of the present invention.

Aspects of the invention are described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art.

In the drawings, the thickness of layers, films, panels, regions, etc., may be exaggerated for clarity. Like reference numerals designate like elements throughout the specification. It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present.

Now, a display device according to an exemplary embodiment of the present invention will be described in detail with reference to FIG. 1, FIG. 2 and FIG. 3.

Figure 2:
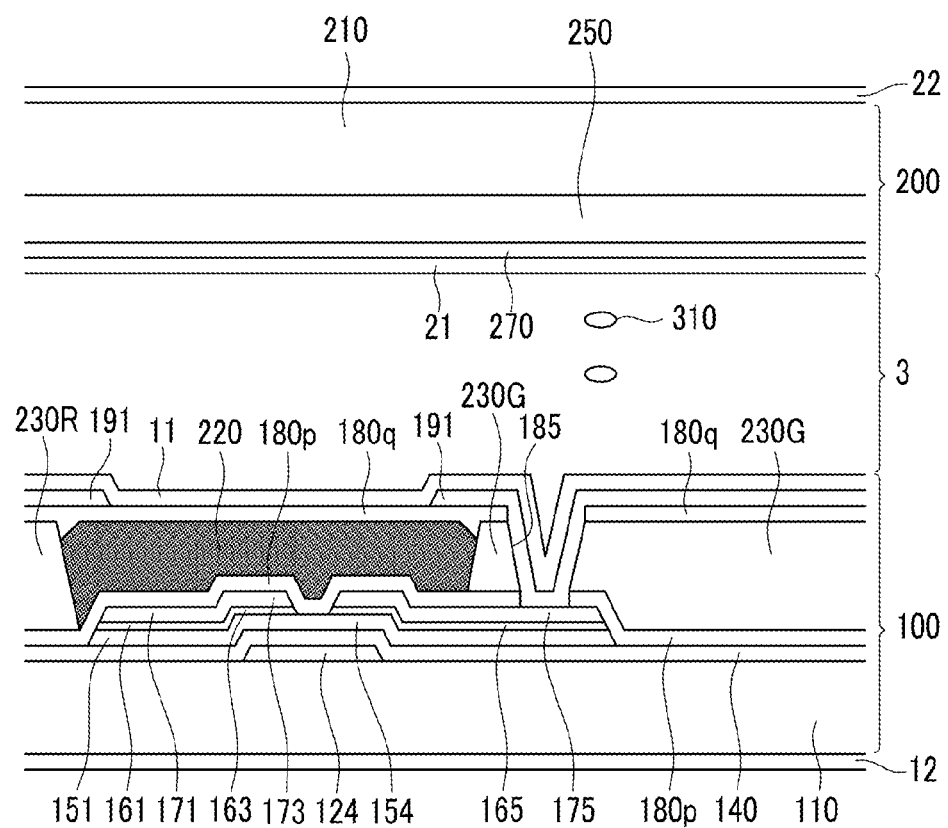
FIG. 2 and FIG. 3 are cross-sectional views along line II-II of FIG. 1.
Figure 3:
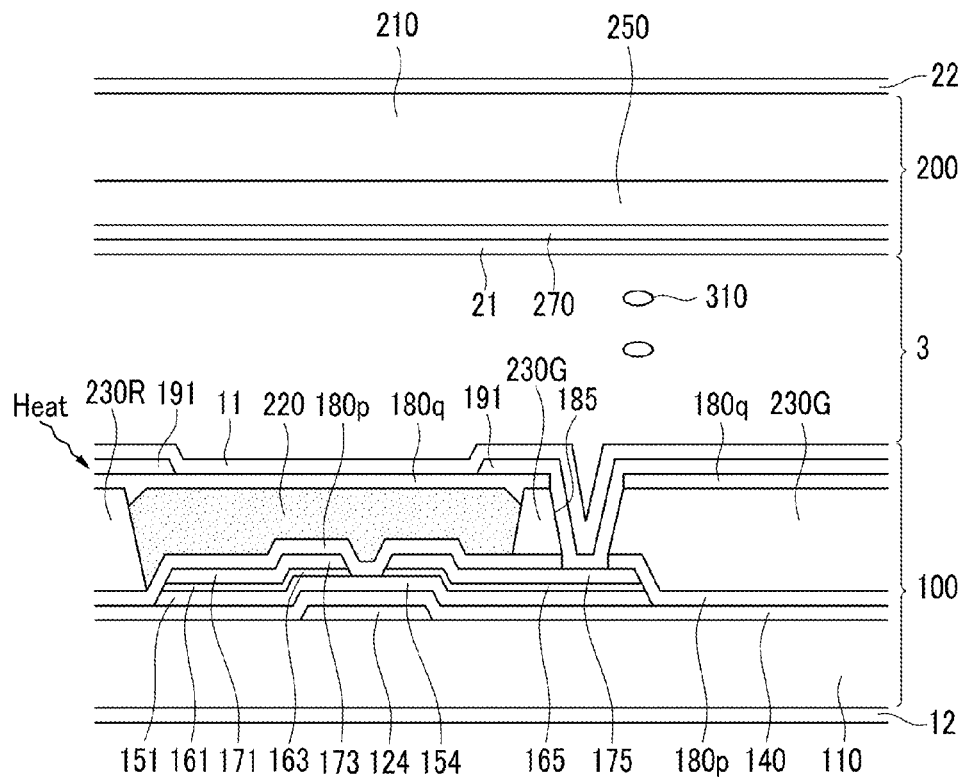

FIG. 1 is a layout view of a liquid crystal display (LCD) according to an exemplary embodiment of the present invention, and FIG. 2 and FIG. 3 are cross-sectional views along the line II-II of FIG. 1.

Referring to FIG. 1, FIG. 2, and FIG. 3, a liquid crystal display (LCD) according to an exemplary embodiment of the present invention includes a thin film transistor display panel 100 and a common electrode display panel 200 spaced apart and facing each other, and a liquid crystal layer 3 interposed therebetween.

First, an exemplary embodiment of the thin film transistor display panel 100 will be described.

A plurality of gate lines 121, which transmit gate signals, are formed on an insulating substrate 110. Each gate line 121 includes a plurality of gate electrodes 124 protruding upward, and an end portion 129 having a wide area for connecting to other layers or an external driving circuit (not shown).

A gate insulating layer 140, which may be made of silicon nitride (SiNx) or silicon oxide (SiOx), etc., is formed on the gate lines 121.

A plurality of semiconductor stripes 151, which may be made of hydrogenated amorphous silicon (a-Si), polysilicon, or so on, are formed on the gate insulating layer 140. The semiconductor stripes 151 generally extend in a longitudinal direction, and include a plurality of protrusions 154 that extend toward the gate electrodes 124.

A plurality of ohmic contact stripes 161 and a plurality of ohmic contact islands 165 are formed on the semiconductor stripes 151. The ohmic contact stripes 161 have a plurality of projections 163. The projections 163 and the ohmic contact islands 165 form pairs disposed on the protrusions 154 of the semiconductor stripes 151. The ohmic contacts 161 and 165 may be made of a material such as n+hydrogenated amorphous silicon in which an n-type impurity such as phosphorus (P) is doped with a high concentration, or of silicide.

A plurality of data lines 171 and a plurality of drain electrodes 175 are formed on respective ohmic contacts 161 and 165 and the gate insulating layer 140.

The data lines 171 transfer a data signal and generally extend in a vertical direction, thereby crossing with the gate lines 121. Each data line 171 includes a wide end portion 179 for connecting to other layers or an external driving circuit (not shown). Each data line 171 also includes a plurality of source electrodes 173 that are extended toward the gate electrodes 124. The drain electrodes 175 are separated from the data lines 171 and are opposite to the source electrodes 173.

One gate electrode 124, one source electrode 173, and one drain electrode 175 form one thin film transistor (TFT) along with a protrusion 154 of a semiconductor stripe 151, and a channel of the thin film transistor is formed in the protrusion 154 between the source electrode 173 and the drain electrode 175.

The semiconductor stripes 151, except for the channel region between the source electrode 173 and the drain electrode 175, may have substantially the same plane shape as the data lines 171 and the drain electrodes 175.

The ohmic contact stripes 161 may be located only between the semiconductor stripes 151 and the data lines 171. The ohmic contact stripes 161 lower contact resistance between the semiconductor stripes 151 and the data lines 171, and have substantially the same plane shape as the data lines 171. The ohmic contact islands 165 may be located only between the semiconductor stripes 151 and the drain electrodes 175, lower contact resistance between them, and have substantially the same plane shape as the drain electrodes 175. The semiconductor stripes 151 may have respective portions that are not covered by the data lines 171 nor the drain electrodes 175 in addition to the channel regions formed in respective protrusions 154 between respective source electrodes 173 and drain electrodes 175.

A lower passivation layer 180$p$ is formed on the gate insulating layer 140, the data lines 171, the drain electrodes 175, and the exposed protrusions 154 of the semiconductor stripes 151. The lower passivation layer 180$p$ may be made of an inorganic insulating material such as silicon nitride or silicon oxide.

A color filter 230 and a light blocking member 220 are formed on the lower passivation layer 180$p$.

The color filters 230 may include red filters 230R, green filters 230G, and blue filters 230B that extend in the direction parallel to the data lines 171 along pixel columns divided by the data lines 171. Neighboring color filters 230R, 230G, and 230B may display different primary colors. The primary colors displayed may be other colors besides red, green, and blue. The color filters 230 may not be formed on the portions of the substrate 110 where the thin film transistors are disposed. Also, a boundary of neighboring color filters 230R, 230G, and 230B may be mainly disposed on the data lines 171, but neighboring color filters 230R, 230G, and 230B may overlap each other near the data lines 171. The red filters 230R, the green filters 230G, and the blue filters 230B may be alternately arranged on every pixel.

The color filters 230 may be made of a photosensitive organic material including a pigment. The above-described lower passivation layer 180$p$ may prevent the pigment of the color filters 230 from flowing into a portion of the exposed protrusions 154 of the semiconductor stripes 151.

The color filters 230 typically do not extend to peripheral areas where the end portions 129 and 179 of the gate lines 121 and data lines 171 are connected to the external driving circuit.

The light blocking member 220, which may be referred to as a black matrix, prevents light leakage. The light blocking member 220 is mainly disposed between the neighboring color filters 230, and may include a stripe portion 221 covering the gate lines 121 and the data lines 171 and being parallel thereto, and may include a protrusion 222 covering the thin film transistor.

The light blocking member 220 may be made of an organic material including a thermochromic material.

A thermochromic material is a material whose color or light transmittance changes according to temperature. Referring to FIG. 2 and FIG. 3, the light blocking member 220 may be made of a material that exhibits a black color or other dark color (light blocking) at room temperature and that changes to be transparent as the temperature increases. That is, the light blocking member 220 may exhibit a black color at a temperature below a threshold temperature Tc and may be changed to be transparent so that the lower layers under the light blocking member 220 may be visible to the outside (through the light blocking member 220) if the temperature is greater than the threshold temperature Tc. The threshold temperature Tc may be in the range from −20° C. to 90° C. Preferably, the threshold temperature Tc may be a temperature near 80° C. considering the general room temperature where a liquid crystal display (LCD) of the present exemplary embodiment may be located. Also, the sensitivity of the transmittance change or color change of the light blocking member 220 including the thermochromic material may be within a range of 1° C. to 2° C. near the threshold temperature Tc. That is, the color or the transmittance of the light blocking member 220 may be completely changed within a range of 1° C. to 2° C. with reference to the threshold temperature Tc. For example, when the threshold temperature is 80° C., the light blocking member 220 may block light at temperatures below 79.5° C., but at 79.5° C. the light blocking member 220 may begin to block less light and transmit more light. As the temperature increases from 79.5° C. to 80.5° C., for example, the light blocking member 220 blocks a decreasing amount of light until a temperature of 80.5° C. is reached. At the temperature of 80.5° C. the light blocking member 220 may be completely changed where light transmission is a maximum and light blocking is a minimum.

The change of the color or the transmittance of the thermochromic material according to temperature may be reversible such that the thermochromic material exhibits a black color at a temperature below the threshold temperature Tc, becomes transparent if the temperature is above the threshold temperature Tc, and may again exhibit the black color if the temperature decreases to be less than the threshold temperature Tc. Optionally, the thermochromic material according to another exemplary embodiment may be a pseudo-thermochromic material exhibiting hysteresis.

Exemplary embodiments of the thermochromic material include: an acid-responsive chromogeneic substance comprising a triphenylmethanephthalide compound, a phthalide compound, a phthalan compound, an acyl-leucomethylene blue compound, a fluoran compound, a triphenylmethane compound, and a diphenylmethane compound; a spiropyran compound; an acidic substance comprising 5-butylbenzotriazole, bisbenzotriazole-5-methane, phenol, nonylphenol, bisphenol A, bisphenol F, 2,2'-biphenol, beta-naphthol, 1,5-dihydroxynaphthalene, an alky p-hydroxybenzoate, and a phenol resin oligomer; rylene dyes; a bridged phthalide; and a sulfinate ester.

Also, exemplary embodiments of the thermochromic material may also include an electron donating chromogeneic organic compound, an electron accepting compound, at least one desensitizer selected from diphenylamine derivatives, at least one desensitizer selected from among carbazole derivatives and an electron-donating chromogeneic material, a 1,2, 3-triazole compound, an azomethine or a carboxylic acid salt, an alcohol, or an amide or ester solvent.

Also, other thermochromic materials may include a reversible thermochromic coloring material such as 6-(dimethylamino)-3,3-bis-(dimethylaminophenyl)-1-(3H)isobenzofuranone (crystal violet lactone), T-anilino-6-diethylamino-3-methylfluoran, 2'-dibenzylamino-6'-diethylaminofluoran, 3,3-bis-(1-butyl-2-methyl-1-H-indol-3-yl)-1 3H-isobenzofuranone, 3-(4-dimethylaminophenyl)-3-(N,N-bis-(4-octylphenyl)amino)phthalide, 2,4,8,10-tetraiodo-3,9-dihydroxy-6-(3',4',5',6'-tetrachlorophenyl-2-phthalido) xanthenone (rose Bengal lactone), 3,3-bis-(4'-hydroxy-3'- methyl-5'-dicarboxymethylamino-methyl)phenyliosbenzofuran-3-one(o-cresolphthalein complexone), 3,3-bis-(sodium-3'-sulfonato-4'-hydroxyphenyl)-4,5,6,7-tetrabromoisobenzofuran-3-one (sulfobromonaphthalein sodium salt), and 3,3-bis-(3',5'-dibromo-4-hydroxyphenyl isobenzofuran-3-one tetrabromophenolphthalein bromocresol green thymolphthalein.

The thermochromic material may be used along with a solvent such as an alcohol, an alcohol-acrylonitrile adduct, an axomethine compound, and an ester.

Also, the light blocking member 220 may further include inorganic black particles such as carbon black or a color pigment made of an organic material to execute the original function of blocking light. When using the color pigment, a plurality of organic pigments that may be used as the pigments of the color filters 230 may be appropriately mixed and used.

When the light blocking member 220 includes the carbon black or the color pigment, the amount of the carbon black or color pigment may be controlled to be a minimum amount so that light may be sufficiently absorbed by the light blocking member 220 at temperature below the threshold temperature Tc wherein the light blocking member 220 exhibits a black color. The light absorbance degree may be expressed as an optical density. Here, the optical density is a scale denoting how much light the light blocking member 220 absorbs when light passes through the light blocking member 220. The optical density may be equivalent to the absorbance related with a light intensity, a thickness of the layer, and an absorbance coefficient. In general, the higher the optical density, the more light the light blocking member absorbs. Conversely, the lower the optical density, the less light the light blocking member absorbs. That is, as the optical density decreases, more light passes through the light blocking member.

According to the present exemplary embodiment, the optical density of the light blocking member 220 may be greater than or equal to 3.0 at a temperature below the threshold temperature Tc of the thermochromic material so that the light blocking member 220 may sufficiently block light. Also, the optical density of the light blocking member 220 may be less than or equal to 2.0 at a temperature above the threshold temperature Tc so that the gate lines 121, the data lines 171, and the thin film transistors that are disposed under the light blocking member 220, or other constituent elements disposed on the light blocking member 220 may be visible to the outside through the light blocking member 220. For this purpose, the amount of the carbon black or the color pigment as well as the amount of the thermochromic material may be controlled. That is, if the optical density of the thermochromic material included in the light blocking member 220 is 3.0 or more at a temperature below the threshold temperature Tc, the carbon black or the color pigment may be omitted. When the optical density is lower than 3.0 at a temperature below the threshold temperature Tc, the carbon black or the color pigment may be appropriately added. However, the thin film transistors should be recognizable through the light blocking member 220 from the outside at a temperature above the threshold temperature Tc of the thermochromic material.

Accordingly, the light blocking member 220 may become transparent by heating under the processes such as a developing process, a manufacturing process, or a defect inspection process of a display panel, such that it is possible to observe and inspect various constituent elements such as the thin film transistors disposed on or under the light blocking member 220. Also, since the change of the color or transmittance of the thermochromic material is reversible in an exemplary embodiment, the light blocking member 220 may return to its original optical density by lowering the temperature after making the light blocking member 220 transparent as necessary.

Also, in another exemplary embodiment of the present invention, the light blocking member 220 may further include a resin composition including a polymerizable compound and a binder.

The polymerizable compound is a compound that is polymerizable by light or heat, such as a monomer or an oligomer. The polymerizable compound may include a compound having carbon-carbon unsaturated bonds and/or carbon-carbon ring-type bonds. As examples, the polymerizable compound may be an unsaturated carboxylic acid compound, an acryl amide based compound, an allyl ester based compound, or a vinyl based compound. The polymerizable compound may be included in the resin composition at about 1 to 20 wt % of the overall content of the resin composition. If less than 1 wt % of the polymerizable compound is included in the resin composition, a pattern may deteriorate and durability may become weaker because the developing ability is lowered. If more than about 20 wt % of the polymerizable compound is included in the resin composition, the coating property may deteriorate.

The binder may be an alkali soluble resin, for example an acryl-based or methacryl-based polymer. The binder may be included in the resin composition at about 1 to 20 wt % of the overall content of the resin composition. If less than about 1 wt % of the binder is included in the resin composition, the coating property may deteriorate. If more than about 20 wt % of the binder is included in the resin composition, the developing ability may deteriorate.

The resin composition for the light blocking member may further include a photoinitiator, a surfactant, and a close-adhesion improving agent as well as the polymerizable compound and the binder.

When the color filters 230 are formed by inkjet printing, the light blocking member 220 may function as a barrier to enclose the materials for the color filters 230. Also, in another exemplary embodiment of the present invention, the positions of the color filter 230 and the light blocking member 220 may be exchanged.

An upper passivation layer 180$q$ is formed on the color filters 230. The upper passivation layer 180$q$ may be made of an inorganic insulating material such as silicon nitride or silicon oxide. The upper passivation layer 180$q$ may prevent the color filters 230 from lifting and may prevent a solvent from flowing from the color filters 230 such that defects such as an afterimage that may be generated during driving may be prevented. The upper passivation layer 180$q$ also may prevent a chemical solution such as an etchant from flowing into the color filters 230 and the light blocking member 220.

The upper passivation layer 180$q$, the color filter 230, and the lower passivation layer 180$p$ have a contact hole 185 exposing the drain electrode 175. The upper passivation layer 180$q$ and the lower passivation layer 180$p$ have a contact hole 182 exposing the end portion 179 of the data line 171. The upper passivation layer 180$q$, the lower passivation layer 180$p$, and the gate insulating layer 140 have a contact hole 181 exposing the end portion 129 of the gate line 121.

A plurality of pixel electrodes 191 and a plurality of contact assistants 81 and 82 are formed on the upper passivation layer 180$q$. They may be made of a transparent conductive material such as indium tin oxide (ITO) or indium zinc oxide (IZO), or a reflective metal such as aluminum, silver, chromium, or alloys thereof.

The pixel electrodes 191 are physically and electrically connected to respective drain electrodes 175 through the contact holes 185, and receive the data voltages from the drain electrodes 175.

The contact assistants 81 and 82 cover the end portions 129 and 179 of the gate lines 121 and the data lines 171 in the contact holes 181 and 182, respectively, thereby being connected thereto. The contact assistants 81 and 82 assist the adhesion of the end portions 129 of the gate lines 121 and the end portions 179 of the data lines 171 to an external device such as an integrated circuit so as to protect them.

The common electrode display panel 200, which faces the thin film transistor display panel 100, includes an insulating layer 250 on an insulation substrate 210, and a common electrode 270 made of a transparent conductor such as ITO or IZO. Optionally, the insulating layer 250 may be omitted.

Alignment layers 11 and 21 are respectively formed on the inside surface of the thin film transistor display panel 100 and the common electrode display panel 200, and polarizers 12 and 22 are respectively provided at outer surfaces thereof.

A liquid crystal layer 3 including a plurality of liquid crystal molecules 310 is interposed between the thin film transistor display panel 100 and the common electrode display panel 200. A voltage is applied between the common electrode 270 and the pixel electrodes 191 such that the direction of the arrangement of the liquid crystal molecules 310 of the liquid crystal layer 3 is determined by an electric field thereby generated to the liquid crystal layer 3.

Next, a manufacturing method of the thin film transistor display panel 100 of the liquid crystal display (LCD) according to an exemplary embodiment of the present invention will be described with reference to FIG. 1, FIG. 2 and FIG. 3.

Firstly, a plurality of gate lines 121, a gate insulating layer 140, a plurality of semiconductor stripes 151, a plurality of ohmic contact stripes 161 and a plurality of ohmic contact islands 165, a plurality of data lines 171 and a plurality of drain electrodes 175, and a lower passivation layer 180p are sequentially formed on an insulation substrate 110.

Next, a photosensitive organic material including a color pigment is coated on the lower passivation layer 180p, and is exposed to light using a mask and developed to form a plurality of color filters 230.

Next, a photosensitive organic material including the above-described thermochromic material is coated on the lower passivation layer 180p and the color filter 230, and is exposed to light using a mask and developed to form a light blocking member 220. The photosensitive organic material for the light blocking member 220 may further include inorganic black particles such as carbon black or a color pigment made of an organic material, a polymerizable compound, or a binder.

The sequence of formation of the color filters 230 and the light blocking member 220 may be exchanged.

Next, an upper passivation layer 180q is formed on the color filter 230 and the light blocking member 220, and is patterned to form contact holes 181, 182, and 185.

Next, a plurality of pixel electrodes 191 and a plurality of contact assistants 81 and 82 are formed on the upper passivation layer 180q.

As above-described, in a display device in which a light blocking member 220 is formed in the thin film transistor display panel 100, by reducing or omitting the amount of carbon black or a color pigment of the light blocking member 220 and by using a thermochromic material that exhibits a black color at a temperature below the threshold temperature Tc and becomes transparent at a temperature above the threshold temperature Tc as a material included in the light blocking member 220, the light blocking member 220 may become transparent according to cases so that the several constituent elements of the thin film transistor display panel 100 may be recognized from the outside. Accordingly, when thin film transistors, gate lines, data lines, and pixel electrodes need to be observed or any defects need to be repaired during or after a developing process or a manufacturing process of a thin film transistor display panel 100, the constituent elements such as the thin film transistors may be easily observed by making the light blocking member 220 transparent.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a display panel, comprising:
   forming signal lines and thin film transistors on a substrate;
   forming a plurality of color filters on the signal lines and the thin film transistors;
   forming a light blocking member comprising a thermochromic material on the signal lines and the thin film transistors; and
   forming a plurality of pixel electrodes on the plurality of color filters and the light blocking member,
   wherein the thermochromic material exhibits a black color at a temperature below a threshold temperature in a range from 78° C. to 82° C. and becomes transparent at a temperature above the threshold temperature.

2. The method of claim 1, wherein
   the light blocking member further comprises a polymerizable compound and a binder.

3. The method of claim 1, wherein
   a transmittance of the thermochromic material is changed within a range of 1° C. to 2° C. with reference to the threshold temperature.

4. The method of claim 1, wherein
   a transmittance change with reference to the threshold temperature of the thermochromic material is reversible.

5. The method of claim 1, wherein
   an optical density of the light blocking member is greater than or equal to 3.0 at the temperature below the threshold temperature, and less than or equal to 2.0 at the temperature above the threshold temperature.

* * * * *